United States Patent
Vernon

(10) Patent No.: US 7,817,252 B2
(45) Date of Patent: Oct. 19, 2010

(54) HOLDER FOR CARRYING A PHOTOLITHOGRAPHY MASK IN A FLATTENED CONDITION

(75) Inventor: Matthew F. Vernon, Los Gatos, CA (US)

(73) Assignee: Intel Corporation, Santa Clara, CA (US)

(*) Notice: Subject to any disclaimer, the term of this patent is extended or adjusted under 35 U.S.C. 154(b) by 997 days.

(21) Appl. No.: 11/529,977

(22) Filed: Sep. 29, 2006

(65) Prior Publication Data

US 2008/0079927 A1    Apr. 3, 2008

(51) Int. Cl.
*G03B 27/62* (2006.01)
(52) U.S. Cl. .................. 355/75; 355/53; 430/5
(58) Field of Classification Search .............. 355/53, 355/75; 430/5
See application file for complete search history.

(56) References Cited

U.S. PATENT DOCUMENTS

| | | | |
|---|---|---|---|
| 3,188,909 A * | 6/1965 | Wally, Jr. et al. ............ 355/76 |
| 6,542,224 B2 * | 4/2003 | Ackerman et al. ............ 355/72 |
| 6,597,434 B2 * | 7/2003 | Van Dijsseldonk ........... 355/75 |
| 6,947,201 B2 | 9/2005 | Ealey | |
| 2004/0013956 A1 * | 1/2004 | Sogard ........................ 430/30 |
| 2004/0051984 A1 * | 3/2004 | Oshino et al. ................ 359/845 |
| 2004/0150871 A1 | 8/2004 | Yang | |
| 2005/0146701 A1 * | 7/2005 | Holderer et al. .............. 355/67 |
| 2006/0050420 A1 | 3/2006 | Smith et al. | |

FOREIGN PATENT DOCUMENTS

JP    2000-286191    * 10/2000

* cited by examiner

*Primary Examiner*—Hung Henry Nguyen
*Assistant Examiner*—Steven H Whitesell-Gordon
(74) *Attorney, Agent, or Firm*—Blakely, Sokoloff, Taylor & Zafman LLP

(57) ABSTRACT

A holder is described for carrying a photolithography mask in a flattened condition. The holder may include a mask chuck and may be able to flatten a mask for use in photolithography. In one example, the holder may include a substrate and a plurality of independently controllable actuators coupled to the substrate and coupled to a photolithography mask to flatten the photolithography mask.

13 Claims, 7 Drawing Sheets

HOLDER FOR CARRYING A PHOTOLITHOGRAPHY MASK IN A FLATTENED CONDITION

BACKGROUND

1. Field

The present description relates to exposure masks for photolithography and, in particular, to a deformable mask holder to provide improved flatness for the mask.

2. Related Art

To increase the number of transistors, diodes, resistors, capacitors, other circuit elements, or mechanical devices on an integrated circuit or micromechanical chip, these devices are placed closer and closer together. This requires that each device be made smaller. Current state-of-the art manufacturing technologies use laser light with a wavelength of 193 nm for photolithography. These are referred to as Deep Ultraviolet (DUV) systems. These systems are being continuously improved and are projected to be able to produce features as small as 20 nm. However, at some point, it is anticipated that a different technology must be applied to continue reducing the size of features using photolithography.

One obstacle to producing still smaller features by photolithography is the wavelength of the light being used. The next step that has been proposed is to use light of 13.4 nm, or other wavelengths in the range of 4 nm-30 nm, referred to as Extreme Ultraviolet (EUV) light. Depending on the rest of the system and process parameters, this light may allow features to be created that are less than 20 nm across and probably as small as 10 nm or less across.

The smaller size of the printed features is a result of the improvement in resolution. The resolution of a photolithography system is proportional to the wavelength of the light divided by the numerical aperture of the illumination system's projection optics. As a result, the resolution can be improved by either decreasing the wavelength of the light used, or by increasing the numerical aperture (NA) of the photolithography projection optics, or both.

As the wavelength of the illumination light is decreased, the lithography process becomes more difficult and more expensive. All known materials absorb EUV light. As a result, the projection optics and the masks used to pattern a substrate using EUV light must be reflective. The shorter wavelength and smaller size of the printed features also increase the requirements for accuracy in all other parts of the lithography system. Typically, the accuracy requirements increase at least proportionally to the reduction in the size of the printed features.

One difficulty in EUV lithography is to ensure that the reflective surface of the EUV mask, also referred to as a reticle, is flat. The reflective surface of the EUV mask may be uneven due to general bowing from weight or from film stresses. It may be uneven due to polishing of the mask substrate and due to bulges created by particles that are trapped on the surfaces that support the mask blank. Variations in the flatness of the reflecting surface of the mask result in positional errors in the projected image on the wafers that are being patterned.

The positional errors are caused, in part, by using a reflective mask. In order to use a reflective mask, the light must hit the mask at an angle in one direction so that it is reflected at an angle in the opposite direction. Proposed angles are about 6 degrees from a normal to the mask surface. For imaging small features using reflective EUV optics, the acceptable placement errors of the features on the silicon wafer (typically less than about 10% of the minimum feature size) requires that the reflecting mask surfaces be flat to within about 50 nm while imaging.

So far, a sufficiently flat reflective EUV mask blank has not been made. In addition, the mask blanks that have been demonstrated become even less flat while the blank is supported in an EUV lithography apparatus, such as a scanner, using for example, an electrostatic chuck. The cost of EUV lithography becomes significantly higher if exceptionally flat EUV blanks are required. In high volume manufacturing, maintaining the mask support surfaces free of particles (which would otherwise distort the front surface flatness) is also a major concern. If the mask stage in EUV wafer exposure tools must be cleaned often, then costs will also be increased because the tool, for example the electrostatic chuck, cannot be used to expose wafers while it is being cleaned.

The current approach being developed for EUV lithography is to obtain mask blanks whose surfaces are flatter than is required so that when these blanks are held using an electrostatic chuck in the EUV scanners, the front reflective surface will meet the flatness specification. These very flat mask blanks are very expensive and so far there are no electrostatic chucks available that can keep the mask blanks flat enough. As semiconductor device dimensions decrease even further, the requirements for flatness become even greater, so that the flatness of the mask becomes a limitation on how many transistors can be formed on a chip.

BRIEF DESCRIPTION OF THE DRAWINGS

Embodiments of the present invention may be understood more fully from the detailed description given below and from the accompanying drawings of various embodiments of the invention. The drawings, however, should not be taken to be limiting, but are for explanation and understanding only.

DETAILED DESCRIPTION OF THE INVENTION

Figure 1:
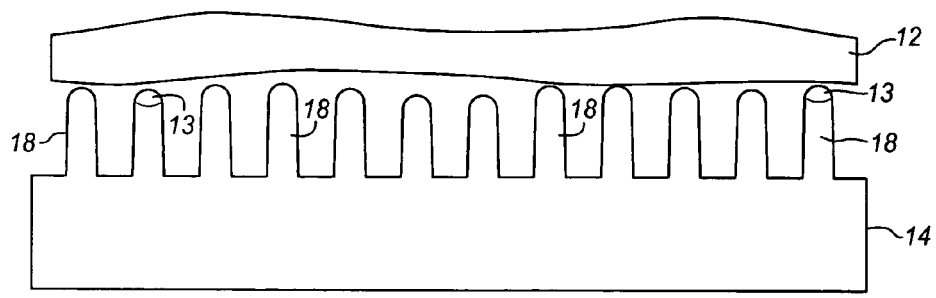
FIG. 1 is a diagram of a mask resting on a mask chuck according to an embodiment of the invention.

Instead of having a mechanically rigid mask chuck manufactured to high dimensional tolerances, a deformable chuck may be used. The deformable chuck may be used not only to flatten itself, but to distort the front surface of an EUV mask to the desired flatness. This may be used to allow the mask to image correctly when the chuck holds the mask in a scanner. With a deformable mask chuck, the blanks used to make EUV masks may be manufactured to lower flatness requirements because the front imaging surface will be made flat by the deformable mask chuck. This allows the manufacturing tolerances for EUV blanks to be relaxed so that the blanks can be produced at significantly lower cost.

A deformable chuck may also be used to compensate for particles that become sandwiched between the mask blank and the mask chuck. Dust and chemical particles can cause bulges underneath the mask that reduce its flatness. With EUV, particles as small as 50 nm can affect the image formed by the reflective imaging surface. The deformation of the front mask surface by a trapped particle can be compensated by the deformable chuck.

The mechanism for flattening the front surface of the mask may be made "bi-polar" in the sense that it can move a part of the mask both toward and away from the chuck. Different locations of the reflective surface might require correction that brings that location closer to or further away from the incident EUV light. The mechanism can move roughly along a line toward either one of two opposite poles at either end of a segment of that line.

In one embodiment, a bi-polar electrostatic chuck may be constructed using thin film deposition techniques. The electrostatic chuck may be deposited on the top surface of a bi-polar deforming element. The electrostatic chuck mechanically references or grips the back side of the mask to a surface of the deforming element. After the mask is gripped by the electrostatic chuck, the deforming surface is deformed to distort the front surface of the mask and make it flat. The flatness may be determined by a flatness metrology tool such as an interferometer.

In another embodiment the deforming piece may be shaped to function as a vacuum chuck. This would not be useful inside a vacuum chamber as proposed for an EUV stepper, but may be used for other wavelengths of light, such as DUV and may be useful for measuring properties of the patterned EUV mask in a reference state. For a reflective mask, the mask support cannot block the front surface of the mask from the incident EUV radiation, so in both of these embodiments, the chuck would hold the mask from behind.

A single deformable chuck may be used for many EUV blanks, each blank possibly requiring a unique deformation to achieve a flat reflective surface. Alternatively, each mask blank may be attached to its own individual deformable chuck. This more permanent attachment allows for the use of other approaches besides an electrostatic or vacuum chuck to mechanically reference the mask to the deforming element. For example, a deforming element whose dimensions match the dimensions of an EUV mask blank may be built. The reflective EUV multilayer coatings, that is the mirror surface, may be deposited directly onto the top surface of the deforming element after the deforming element is polished. In other words, the glass substrate used for an EUV mask blank would be replaced by a deforming element.

Not only does this eliminate the complexity of the mask chuck but provides additional benefits. For example, there are new options for dissipating the heat absorbed by the EUV multilayers. EUV mirrors, made from thin multilayer coatings, absorb about 30% of the EUV light that shines on them. This is mostly converted into heat, so cooling must be provided which is not necessary with mirrors for longer wavelength light that absorb less than 5% of the incident light. In addition, eliminating the thick, rigid mask substrate allows for the flatness to be better corrected. Flatness errors may be corrected at higher spatial frequencies. The actuators that cause the deformation may be electromechanical, piezoelectric, or of any other type. Electro-mechanical actuators of a type used to support deformable mirrors for astronomy may be used.

In some EUV lithography scanners, the EUV masks are held upside down in a reticle stage which is a sub-system of an EUV scanner. The EUV mask reflects the EUV radiation from its front surface and is held by its back surface by an electrostatic chuck so that the front surface is free from obstructions and is fully available for imaging.

The different fields on the wafer are exposed in a step and scan manner by the EUV scanner. The wafer stage moves the wafer to the next field position to be exposed. Once there, the wafer and reticle stages are scanned at uniform speeds to expose that field on the wafer. The mask scan direction alternates with each field exposed on the wafer field to minimize the time to expose a wafer. As the mask reticle stage is reversed in direction, it can experience strong inertial lateral accelerations and high velocities. An effective electrostatic chuck holds the reticle upside down without slipping in the presence of these lateral accelerations and also maintains a flat front surface on the reticle during exposure.

Electrostatic mask chucks are used in production environments because they are able to quickly hold and carry different masks. Using the actuators mentioned above, a mask chuck may also be adjusted to individually deform each mask to flatten the front surface. This can be done, for example by shining light on the mask and then providing the reflections to an interferometer. Measurements from the interferometer are used to control the movement of the mask chuck until the interferometer measures the mask as being sufficiently flat.

As mentioned above, small particles can become attached to the back surface of an EUV mask or to the contact surface of a mask chuck during routine use. If particles are trapped between the back side of the EUV mask and the contact surface of the mask chuck, then they will produce some distortion of the mask front surface. The individual actuators may also be used to minimize the impact of particles on the flatness of the front surface of the mask.

FIG. 1 is a diagram of a mask 12 resting on an electrostatic gripper which in turn is held by or bonded to the deforming element 14. The deforming element might have a plurality of pedestals 18. In the example of FIG. 1, each pedestal has an electrostatic chuck surface 13 at the end closest to the mask. In FIG. 1, the pedestals are all the same length. Neither the front side nor the bottom side of the mask is flat. The deformations in the mask are not drawn to scale in order to better show the effect of the pedestals in FIG. 2.

Figure 2:
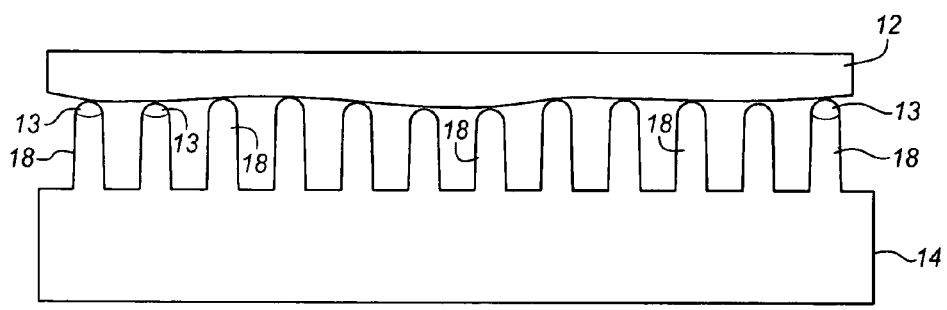
FIG. 2 is a diagram of the mask of FIG. 1 resting on the mask chuck of FIG. 1 after the mask has been flattened according to an embodiment of the invention.

FIG. 2 is a diagram of the configuration of FIG. 1 after the pedestals have been operated to flatten the mask. The electrostatic chuck surface 13 at the end of each pedestal 18 has been activated to grip the back surface of the mask 12 and the lengths of the pedestals have been adjusted. The pedestals are bipolar and have pushed the mask away from the deforming element 14 in some places and pulled the mask toward the deforming element in other places. Each pedestal independently deforms the mask in regions corresponding to each pedestal. The movement of the pedestals has rendered the mask flat. The back surface of the mask is not flat and is less flat than before. However, in this example, the mask is reflective using the front surface and the shape of the back surface is not important to the imaging quality of the mask.

As an alternative to the configuration of FIGS. 1 and 2, the mask may simply be mechanically attached to the pedestals, using a suitable adhesive, welding, soldering or other bonding technique. This avoids the need for the electrostatic grippers on each pedestal.

Figure 3:
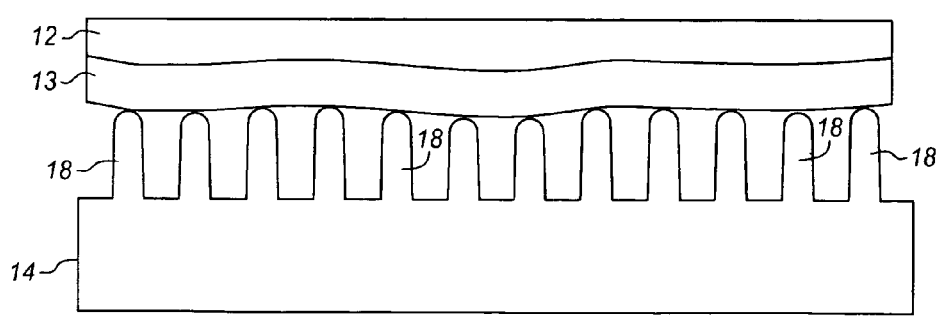
FIG. 3 is a diagram of a mask flattened by a mask chuck and held together using an electrostatic grip layer according to an embodiment of the invention.

FIG. 3 is a diagram of an alternative configuration using the same deforming element 14 and the same pedestals 18 as in FIGS. 1 and 2. However, the electrostatic chuck 13 is constructed as a sheet of flexible material physically attached to the pedestals. As the pedestals operate, the chuck is bent. The chuck mechanically references the mask to the pedestal positions to deform the mask. Such an electrostatic chuck may be made of a metallic sheet covered with a layer of dielectric material. The dielectric material contacts the mask and the metallic sheet is charged to generate an electrostatic force to grab the mask.

The embodiment of FIG. 3 uses a simpler chuck design that is simpler to operate. However, the sheet of material may limit the range of motion that can be exerted on the mask. In the examples of FIGS. 2 and 3, the flattened mask may be handled using the base of the deformable element or using a suitable fixture attached to the deformable element for the processing equipment with which it will be used.

Figure 4:
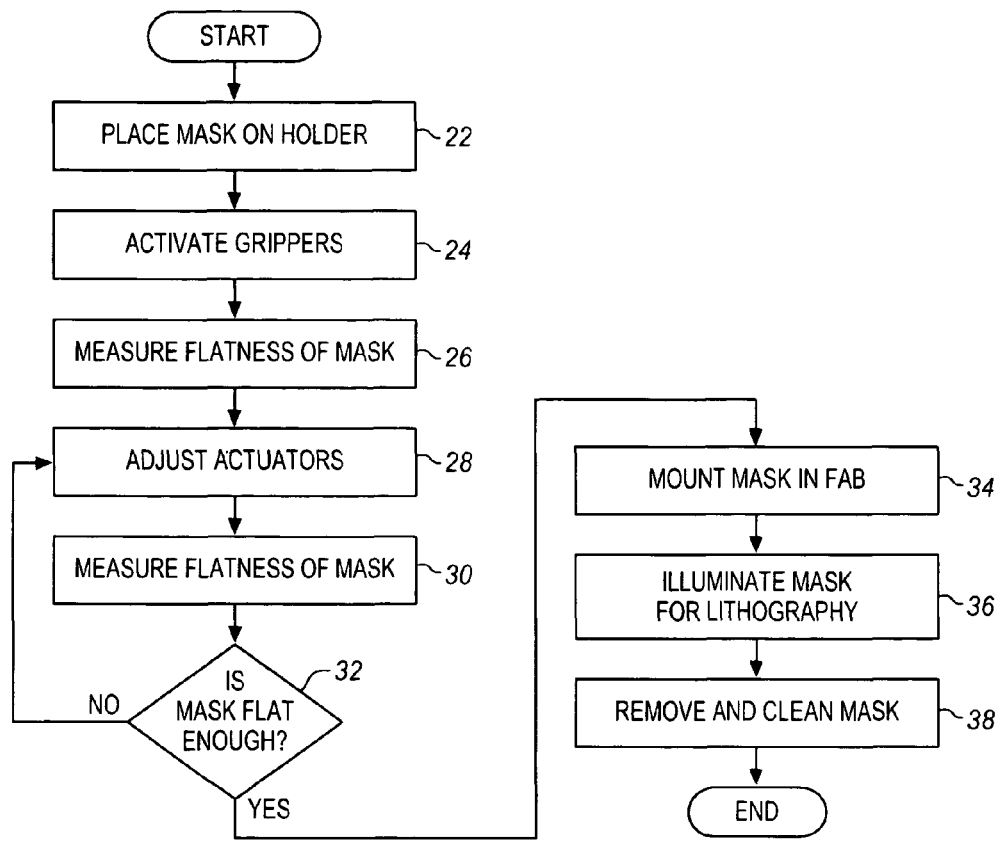
FIG. 4 is an example sequence for flattening a mask according to an embodiment of the invention.

FIG. 4 shows an example sequence that may be used for test and for production for a mask and a deformable mask holder. The electrostatic chuck may be similar to that of FIGS. 1, 2, or 3 or have any of a variety of other configurations described in more detail below. In FIG. 4, a mask is placed on the mask holder or chuck at block 22. At block 24, a voltage is applied to the mask chuck to actuate the electrostatic gripper or grippers. The electrostatic force will firmly hold the mask to the deformable fixture. As mentioned above, while an electrostatic chuck is discussed, a variety of other mechanisms or forces may be used to hold the mask in place. At block 26, the flatness of the mask front surface is measured. This may be done, for example, using a large beam interferometer.

Based on the measurement, the individual pedestals that support the back side of the mask are adjusted. In practice, the measurement may be a list of many different measurements, each representing the distance or variation at different positions on the mask. The actuators for the deformable element of the mask holder are then operated at block 28 to flatten the mask. This may be, for example, the pedestals 18 described above. Alternatively, if a deformable fixture is used, then it is deformed based on the measurements. The particular type of actuators used may depend on the particular application.

At block 30, the flatness of the front surface is measured again. At block 32, if the mask front surface is not flat enough then the chuck actuators are adjusted again at block 28. The deformable fixture is iteratively adjusted to achieve a sufficiently flat front mask surface as measured by the interferometer.

When the iterations are completed and the mask is sufficiently flat, the mask is ready for use in photolithography. In one example, the mask and mask chuck are mounted in a lithography system at block 34 so after the actuators have flattened the front surface within specification, photolithography can begin. At block 36, the mask is illuminated in the lithography system to expose layers on a wafer and at block 38, the mask is removed from the lithography system. It may be removed from the mask holder or remain with the mask holder. After some number of illumination cycles it may be cleaned. The flattening process may be repeated for each exposure or only after certain intervals.

After the mask front surface has been flattened, the deforming or actuator control signals are maintained or monitored to maintain the mask in this flattened state during processing. The particular control signals that are to be used to maintain the condition of the mask will depend on the type of chuck actuator that is used.

Figure 5:
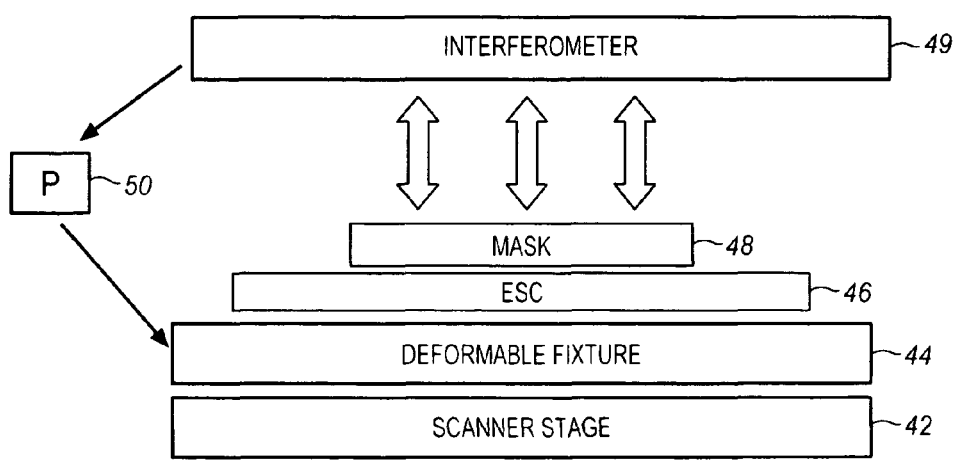
FIG. 5 is a diagram of an example measurement system for flattening a mask using a mask chuck according to an embodiment of the invention.

FIG. 5 is a diagram of an example measurement system for measuring the flatness of the mask. In FIG. 5, a scanner stage 42 supports a deformable fixture 44. The reticle stage is a part of the photolithography scanner and is used to hold the mask in the processing chamber. A mechanical driver moves the reticle stage as the mask image is scanned across the wafer. The mask chuck is shown as having two parts, a deformable fixture 44 and an electrostatic chuck 46. This is just one example of a mask holder. A variety of other approaches may be used instead. The mask 48, is held in place by the electrostatic chuck. An interferometer 49 shines light on the mask and measures reflections to determine the flatness of the mask. Any of a variety of different interferometers may be used to measure the flatness. A processor 50 receives the results and sends control signals to the deformable fixture to adjust individual positions in the fixture to flatten the mask. The particular nature of the control signals will depend upon the particular design of the mask chuck.

Figure 6:
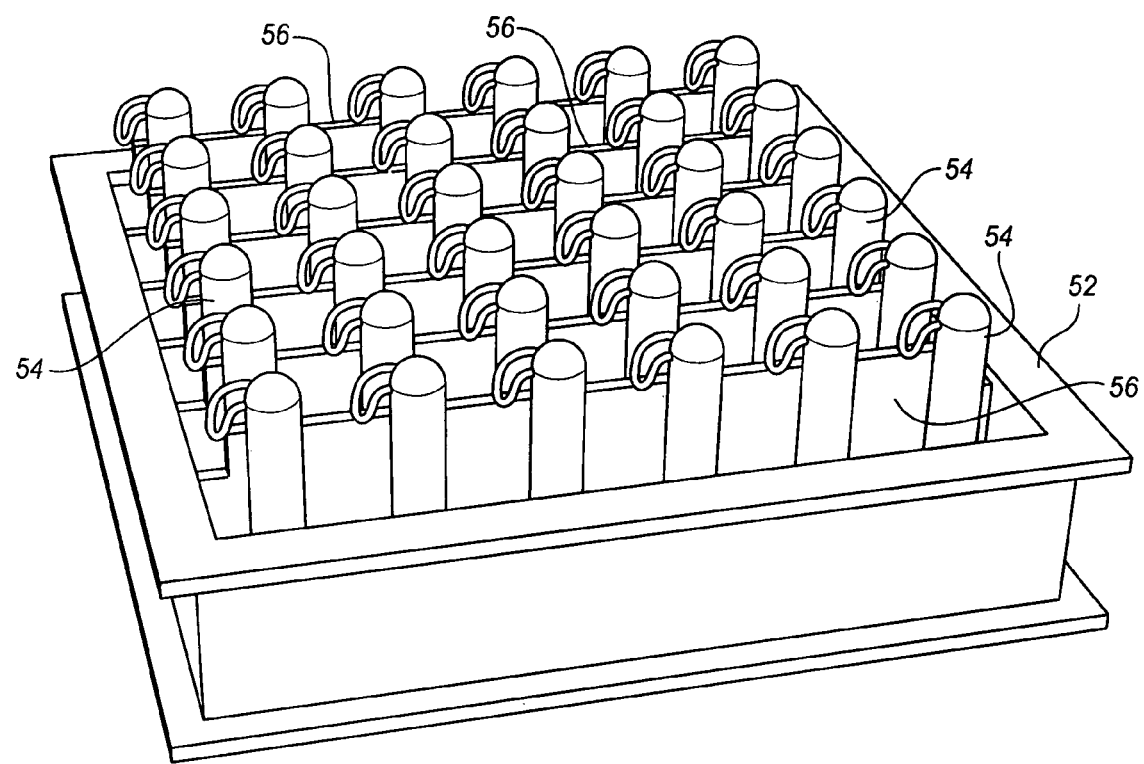
FIG. 6 is a diagram of a mask holder or mask chuck according to an embodiment of the invention.

FIG. 6 shows an example of a mask chuck that may be used for the types of mask holders described above with reference to FIGS. 1, 2, and 3. The mask chuck has a solid, rigid platform 52 that may be made from billet aluminum, beryllium, ceramic, or some other rigid material. The platform is thoroughly cross-braced with braces 56 that form parallel rows perpendicular to the surface of the platform. An array of pedestals 54 is mounted to the platform. Each pedestal is individually adjustable up and down towards and away from the platform. An array of control wire leads (not shown) extends from the bottom of the pedestals. Each pedestal is bonded to an electrostatic gripper on its top surface. These may be individually controllable or controlled as a group depending on the application. The grippers are all wired to all external controller (not shown).

The square shape of the mask chuck resembles the shape of a conventional mask. The particular number of pedestals may be adjusted depending on the particular application, the magnitude and spatial wavelengths of the flatness errors to be corrected, and on the rigidity of the mask. Mask blanks for 193 nm photolithography have dimensions of 6" (152 mm) by 6" (152 mm) by 0.25" (6 mm) and if supported by pedestals spaced about 1" (25 mm) apart would be able to correct for low order spatial frequency flatness errors.

Figure 7:
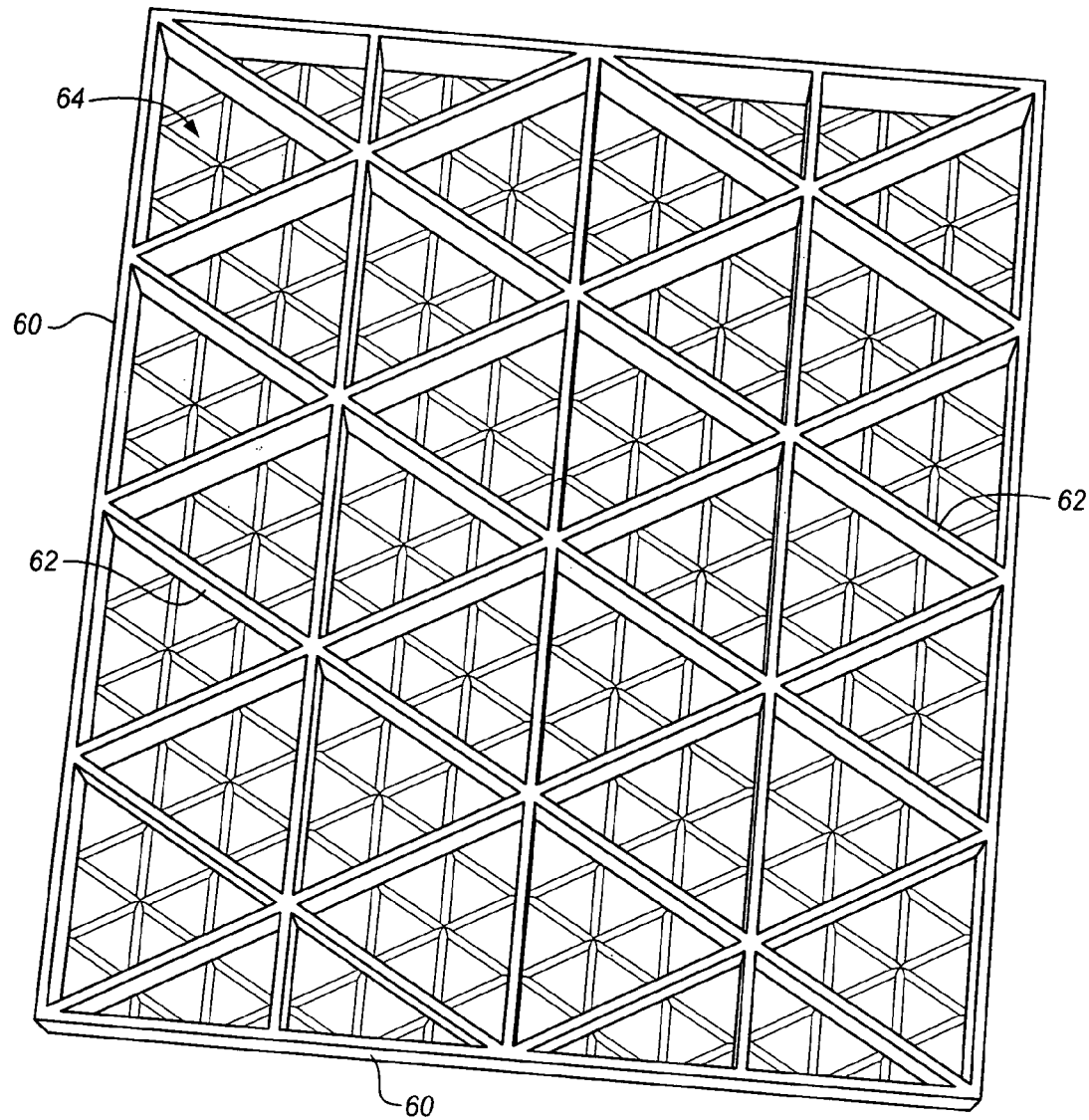
FIG. 7 is a diagram of a deformable substrate suitable for use as a mask holder or mask chuck according to an embodiment of the invention.

FIG. 7 shows an alternative design for a mask holder that uses a deformable substrate 60. FIG. 7 shows the underside of the holder. The bottom 64, as shown in FIG. 7 supports a top surface on the other side that deforms. The top surface also carries the electrostatic chuck, if used, and the mask. The square substrate has a honeycomb structure with a pattern of intersecting vertical ribs 62. The floor 64 of the substrate is also cross-braced with a pattern of low ridges, for additional stiffness. The entire substrate may be made of silicon carbide, ceramic, plastics, or some other rigid material. Each crossing point of the taller ribs supports a piezoelectric actuator (not shown) that deforms the top surface in response to an applied voltage as described in the context of FIG. 8.

Vertical actuators on fixtures similar to those shown in FIGS. 6 and 7 are currently in use for supporting and deforming astronomical mirrors. The mirrors are permanently fixed to the actuators or the substrate and can be controlled to overcome distortions and for other effects.

An electrostatic gripper may be applied to the opposite surface of the substrate by embedding additional metal films near the top surface of the substrate. The positions for the films may be selected to be very close to the back surface of the mask which has a corresponding metal film applied. A capacitor is established between these two surfaces. By applying a voltage to the two metal surfaces of the capacitor, there will be an electrostatic attraction between the substrate and the mask.

The substrate of FIG. 7 represents a monolithic block of ceramic produced using three-dimensional ceramic processing. It contains close-spaced individually addressable actuators with integrated electric traces. The actuators are physically separated at the requisite spacing after the ceramic is fully processed. Interconnects are placed on the back side of the module to allow the actuators to be electrically addressed. Several individual modules may be joined to create much larger arrays of actuators. The silicon carbide base material provides high specific stiffness, light weight, and low inertia as well as thermal performance similar to that of low expansion glasses. Masks are conventionally made from low expansion glasses, such as quartz, however, a reflective mask blank may be made from a variety of other low expansion materials, including silicon carbide. Other materials may be used in addition to, or instead of silicon carbide for both the substrate and the mask.

Figure 8:
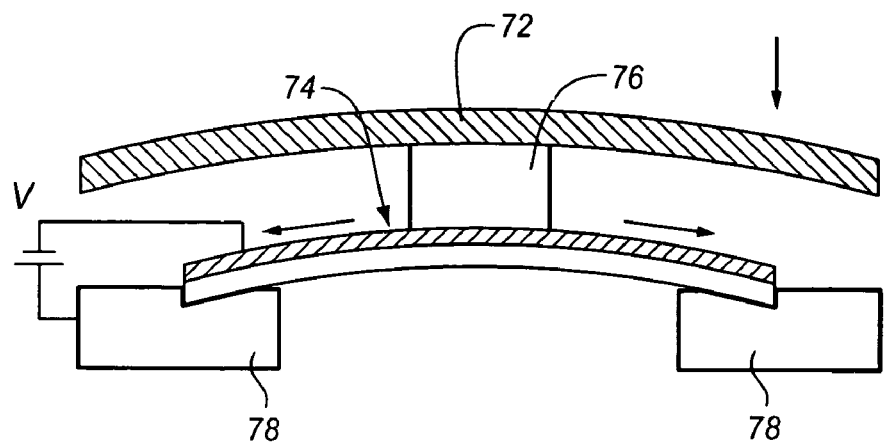
FIG. 8 is a diagram of a piezoelectric actuator for the mask holder or mask chuck of FIG. 7 according to an embodiment of the invention.

The substrate of FIG. 7 may be deformed using, for example, a matrix of individually controllable piezoelectric actuators, such as piezoelectric unimorphs as shown in FIG. 8. A voltage applied to a piezoelectric layer may be used to induce stress in a longitudinal direction causing the top surface to deform and either push the surface up or down. If the actuators operate using a capacitive effect, then they consume power only when the position setting is altered.

FIG. 8 is a diagram of such an actuator. In the example of FIG. 8, the top surface of the substrate 72 is coupled to an actuator 74. Alternatively the surface 72 may be a surface beneath the top surface of the FIG. 7 structure. The actuator may be made of a thick sheet of composite glass unimorph film. PZT film (lead zirconium titanate) or another material may be used. The film is mounted at either end to a support 78. The support may be fastened to the ribs or the side walls shown in FIG. 7. A pedestal 76 couples the flexible actuator 74 to the top surface 72 and transfers movement of the actuator to the top surface.

The end supports are rigidly fastened to the structure. When a voltage V is applied to the unimorph layer 74, the unimorph layer is stressed longitudinally and deforms. In the example of FIG. 8, the layer will bend upward. This motion is transferred to the top layer and can then be used to bend the mask.

Figure 9:
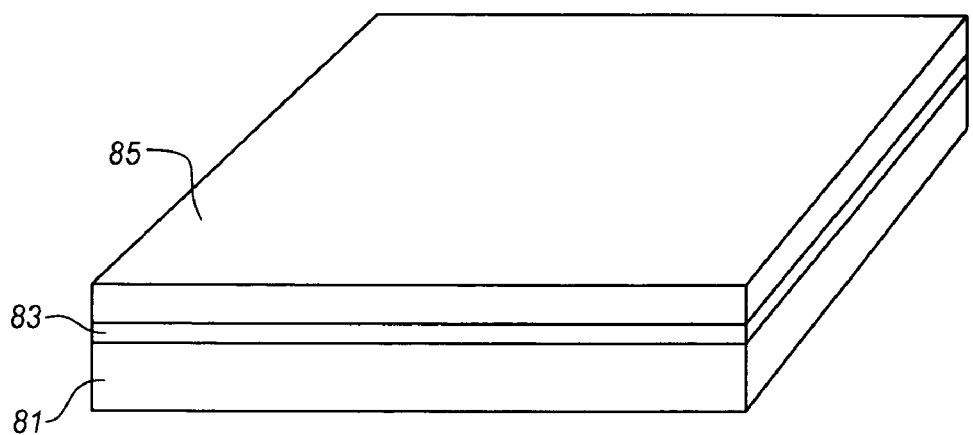
FIG. 9 is a diagram of an alternative mask holder or mask chuck according to an embodiment of the invention.

FIG. 9 is a diagram of a deformable mask chuck constructed using the principles shown in FIGS. 7 and 8. The bottom layer 81 is the silicon carbide structure of FIG. 7. It includes independently controllable longitudinal actuators (not shown) of the type shown in FIG. 8. An electrostatic chuck surface 83 is formed over the bottom block. As mentioned above, this may be formed by depositing a conductive layer directly over the composite bottom block structure and a dielectric layer over the conductive layer. Appropriate electrical connections to operate the longitudinal actuators and the chuck are not shown. A mask 85 is electrostatically connected to the chuck. As mentioned above, a vacuum chuck may alternatively be used when the mask is not to be held in a vacuum chamber. As a further alternative, the mask 85 may be formed directly on the silicon carbide structure and actuators 81, eliminating the need for the chuck layer and its control system.

The bottom block forms a rigid support surface for a substrate onto which the mask is deposited. The substrate is deformed by the multiple actuators. The longitudinal actuators independently deform the substrate in regions corresponding to each actuator.

The mask chuck described herein may be used in many different aspects of the lithography process. These include holding mask blanks in mask pattern generators, and holding masks in pattern placement accuracy metrology tools, as well as in scanners where the front imaging surface must be in a known flattened state.

Figure 10:
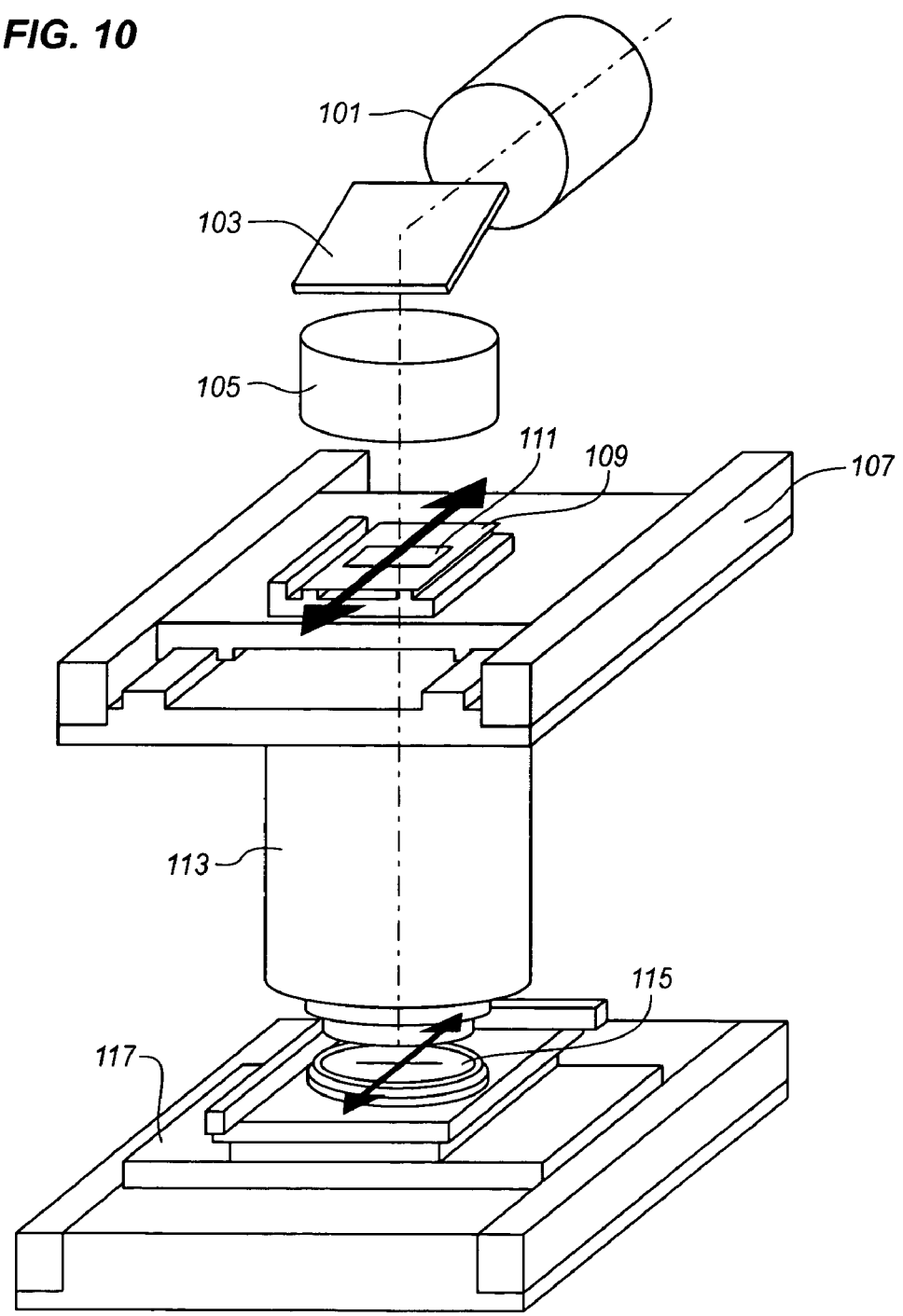
FIG. 10 is a diagram of a photolithography machine suitable for use with embodiments of the invention.

FIG. 10 shows a conventional architecture for a semiconductor fabrication machine, in this case, an optical lithography machine, that may be used to hold a mask and expose a wafer in accordance with embodiments of the present invention. The stepper may be enclosed in a sealed vacuum chamber (not shown) in which the pressure, temperature and environment may be precisely controlled. The stepper has an illumination system including a light source 101, such as an excimer laser or Xenon gas discharge chamber, and an optical collection system 105 to focus the light on the wafer. A reticle scanning stage 107 carries a mask chuck 109 which holds the mask 111. The light from the lamp is transmitted onto the mask and the light transmitted through the mask is focused further by a projection optical system with, for example, a four-fold reduction of the mask pattern onto the wafer 115.

The stepper of FIG. 10 is an example of a fabrication device that may benefit from embodiments of the present invention. Embodiments of the invention may also be applied to many other photolithography systems, including those that use imprint printing. The stepper is shown diagrammatically. The optical elements may be reflective rather than transmissive and the relative positions of the various components may be changed.

Figure 11:
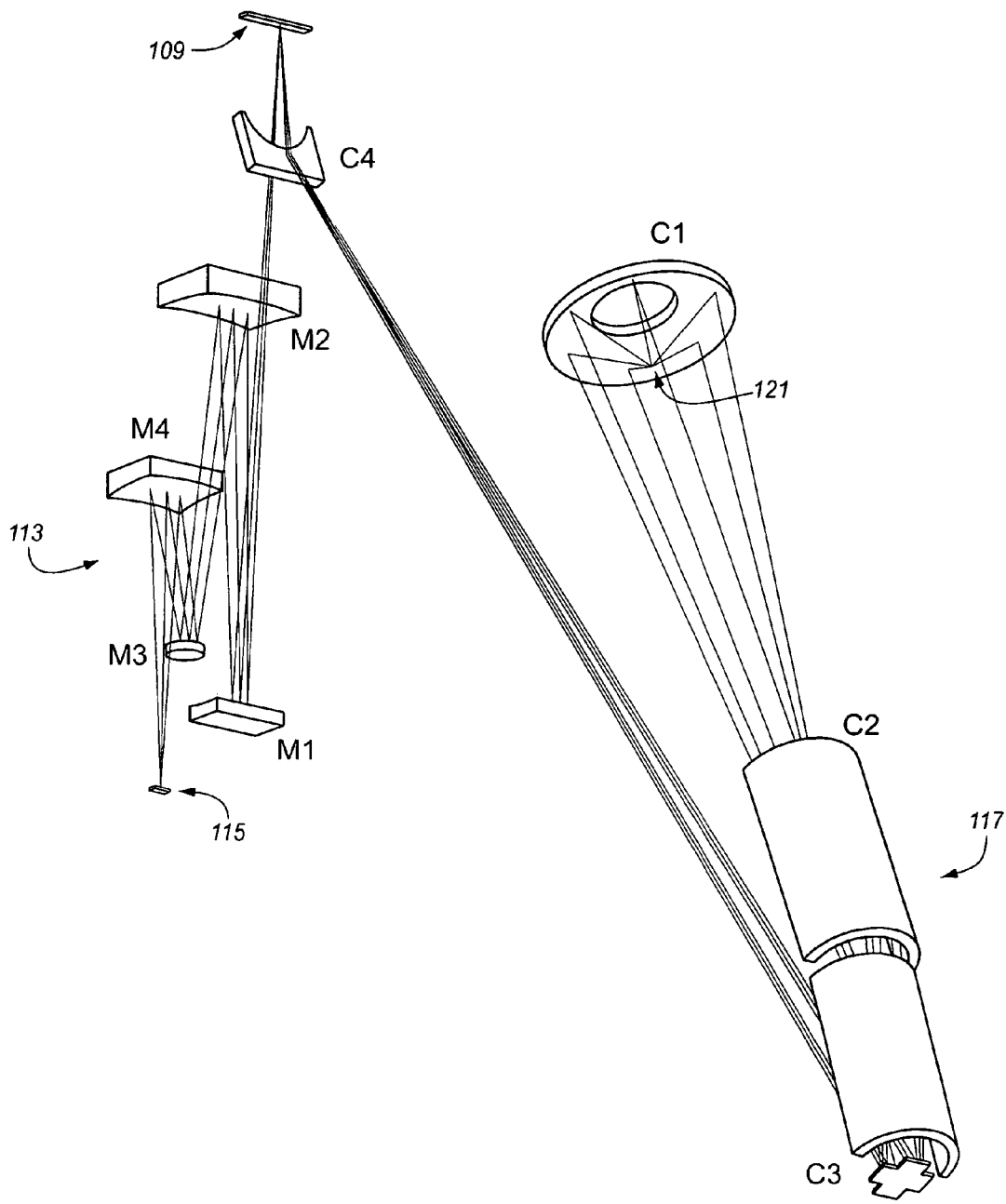
FIG. 11 is a diagram of an alternative photolithography machine suitable for use with embodiments of the invention.

FIG. 11 is a diagram of an example of an EUV lithography system that may be used in a similar fashion as the optical lithography tool as shown in FIG. 10. The lithography tool has a plurality of mirrors C1, C2, C3 in a collector 117 to collect light from an EUV source 121. The projection optics 113 also has a set of mirrors M1, M2, M3, M4 to project the EUV illumination reflected from the mask 109 held by a mask holder onto the wafer 115. The particular configuration and number of mirrors may be modified to suit different applications and improvements in designs. Each of the mirrors forms an optical element for its respective optical system.

A lesser or more complex mask, mask chuck, mask holder, deformable element and photolithography process or system may be used than those shown and described herein. Embodiments of the invention may be applied to transmissive as well as to reflective masks. Additional components may be added to the illustrated mask holders to suit different applications and different lithography applications. Additional layers and devices may be positioned between the mask holder and the mask. Therefore, the configurations may vary from implementation to implementation depending upon numerous factors, such as price constraints, performance requirements, technological improvements, or other circumstances. Embodiments of the invention may also be applied to other types of photolithography systems that use different materials and devices than those shown and described herein.

In the description above, numerous specific details are set forth. However, embodiments of the invention may be practiced without these specific details. For example, well-known equivalent materials may be substituted in place of those described herein, and similarly, well-known equivalent techniques may be substituted in place of the particular processing techniques disclosed. In other instances, well-known circuits, structures and techniques have not been shown in detail to avoid obscuring the understanding of this description.

While the embodiments of the invention have been described in terms of several examples, those skilled in the art may recognize that the invention is not limited to the embodiments described, but may be practiced with modification and alteration within the spirit and scope of the appended claims. The description is thus to be regarded as illustrative instead of limiting.

The invention claimed is:

1. A photolithography mask comprising:
a deformable substrate having a honeycomb structure with a pattern of intersecting vertical ribs and cross-braced with a pattern of low ridges for additional stiffness;
a plurality of vertical piezo-electric actuators at intersections of the vertical ribs to independently deform the substrate in response to an applied voltage in regions corresponding to each actuator;
a photolithography mask pattern attached to the deformable substrate having a front surface for photolithographic imaging and a back surface, the back surface including a metal film; and
an electrostatic gripper applied to the substrate as metal films close to the back surface of the mask pattern to hold the mask pattern to the substrate.

2. The photolithography mask of claim 1, wherein the actuators comprise a plurality of independently controllable actuators coupled to the substrate to independently deform the substrate in regions corresponding to each actuator.

3. The photolithography mask of claim 1, wherein the gripper comprises a conductive layer covered by a dielectric layer and electrical connections to charge the conductive layer.

4. The photolithography mask of claim 1, wherein the mask is formed of layers deposited over the substrate.

5. The photolithography mask of claim 1, wherein the substrate is deformable and the actuators act to deform the substrate.

6. The photolithography mask of claim 1, wherein the pattern comprises a plurality of reflective layers deposited over the deformable substrate.

7. The photolithography mask of claim 1, further comprising a rigid block to which the actuators are connected.

8. The photolithography mask of claim 1, wherein the honeycomb structure is ceramic.

9. The photolithography mask of claim 8, wherein the actuators comprise longitudinal piezoelectric actuators attached to the ceramic honeycomb.

10. The photolithography mask of claim 1, wherein the actuators comprise piezoelectric unimorphs.

11. The photolithography mask of claim 1, wherein the actuators are constructed so that an applied voltage induces stress in a longitudinal direction causing the actuator to deform either towards or away from the substrate.

12. The photolithography mask of claim 1, wherein the actuators comprise a flexible film mounted at either end to a support fastened to the ribs of the substrate, the film bending upon the application of a voltage.

13. The photolithography mask of claim 12, wherein the actuators further comprise a pedestal to couple movement of the flexible film to the mask pattern.

* * * * *